United States Patent
O'Dowd

(10) Patent No.: US 6,807,204 B1
(45) Date of Patent: Oct. 19, 2004

(54) OPTOELECTRONIC DEVICE INCORPORATING A TUNABLE LASER AND METHOD OF CHARACTERIZATION THEREOF

(75) Inventor: Ronan O'Dowd, Blackrock (IE)

(73) Assignee: Tsunami Photonics Limited, Dublin (IE)

( * ) Notice: Subject to any disclaimer, the term of this patent is extended or adjusted under 35 U.S.C. 154(b) by 0 days.

(21) Appl. No.: 10/110,415

(22) PCT Filed: Oct. 16, 2000

(86) PCT No.: PCT/IB00/01476

§ 371 (c)(1),
(2), (4) Date: Apr. 11, 2002

(87) PCT Pub. No.: WO01/28052

PCT Pub. Date: Oct. 16, 2000

(30) Foreign Application Priority Data

Oct. 15, 1999 (IE) ............................................. S99/0865
Dec. 6, 1999 (IE) ............................................. S99/1022

(51) Int. Cl.[7] .............................. H01S 3/13; H01S 3/00
(52) U.S. Cl. .............................. 372/32; 372/28; 372/31; 372/29.015; 372/25
(58) Field of Search .............................. 372/32, 29.015, 372/31, 38.07, 38.02, 38.09, 20

(56) References Cited

U.S. PATENT DOCUMENTS

| | | | |
|---|---|---|---|
| 4,549,782 A | | 10/1985 | Miller |
| 4,575,180 A | | 3/1986 | Chang |
| 5,351,253 A | * | 9/1994 | Wong ...................... 372/29.02 |
| 5,642,371 A | * | 6/1997 | Tohyama et al. ............. 372/45 |
| 6,064,681 A | * | 5/2000 | Ackerman ................... 372/32 |
| 6,233,263 B1 | * | 5/2001 | Chang-Hasnain et al. .... 372/32 |
| 6,301,280 B1 | * | 10/2001 | Broutin et al. ............ 372/38.01 |
| 6,504,856 B1 | * | 1/2003 | Broberg et al. .......... 372/38.07 |
| 2002/0126345 A1 | * | 9/2002 | Green et al. ................. 359/122 |

FOREIGN PATENT DOCUMENTS

| | | |
|---|---|---|
| EP | 0438759 | 7/1991 |
| EP | 0481464 | 4/1992 |
| EP | 0529732 | 3/1993 |
| EP | 0559192 | 9/1993 |
| EP | 0284908 | 10/1998 |
| WO | WO 98/43327 | 10/1998 |
| WO | WO 99/40654 | 8/1999 |

OTHER PUBLICATIONS

Schienle M, et al "A Frequency Stabilization Arrangement for Dense Wavelength Division Multiplexing Systems" IEEE Photonics Technology Letters, 4(5), May 1, 1992, 507–509; IEEE, New York, US.

Glance, B et al "One–THz Digital Random Access High Resolution Optical Frequency Synthesizer Providing Cold–Start Operation from a Frequency Reference", IEEE Globecom '90. IEEE Publin XP000220883, pp. 766–767 IEEE, New York US.

* cited by examiner

Primary Examiner—Don Wong
Assistant Examiner—Dung Nguyen
(74) Attorney, Agent, or Firm—Timothy J. Keefer; Seyfarth Shaw LLP

(57) ABSTRACT

A hybridized optoelectronic device having a multi-section laser and a wavelength measuring component such that stable operational characteristics remote from mode boundaries may be determined and stored in a look-up table. A fast means of characterizing the device using sampling techniques is also disclosed. The device may incorporate a frequency-locking component to enable the laser to emit radiation at predetermined frequencies.

14 Claims, 13 Drawing Sheets

OPTOELECTRONIC DEVICE INCORPORATING A TUNABLE LASER AND METHOD OF CHARACTERIZATION THEREOF

The present invention relates to an optoelectronic device incorporating a tunable laser and a method for the characterisation thereof.

Tunable single section lasers are known which are tunable by changing the operating temperature of the laser, and methods of characterising such lasers, that is determining the operating conditions required to emit a given wavelength, are also known from, for example WO 98/00893 and U.S. Pat. No. 5,019,769. Because of variations between devices, such characterisation must be carried out for each individual device, with the operating conditions being stored in a memory associated with the laser. However, such single section lasers are tunable over only a small range of wavelengths.

Multi-section tunable semiconductor lasers are known, from, for example, EP-A-0300790, which are tunable over a wider range of wavelengths by adjusting currents injected into filter and phase sections of the laser. However, such lasers are subject to mode jumps between different wavelengths. For stable operation it is important to determine operating conditions in a mode plane away from these mode boundaries.

A method of characterising such multi-section lasers is disclosed in WO 99/40654. The position of mode planes is determined and at least a part of the mode planes are stored in a memory. However, the corresponding wavelength of the emitted radiation may only be determined by an external instrument in order to be stored in the memory to form a look-up table of operating conditions required for particular wavelength emission. This is particularly inconvenient for necessary re-calibration during use. The time to characterise each laser is also considerable.

The applicant is also aware of WO 00/52789, WO 00/54380 and WO 00/54381, which all have priority dates earlier than the priority dates of the present application, but were published after the priority dates of the present application, and therefore can form part of the state of the art for novelty purposes only.

The object of the present invention is at least partially to ameliorate the above difficulties.

According to a first aspect of the present invention there is provided an optoelectronic device including a tunable laser hybridised with wavelength measuring means for measuring wavelength of radiation emitted by the laser, wherein the wavelength measuring means includes long period diffraction grating means having a known relationship between the wavelength of an incident beam and a proportion of power of the incident laser beam transmitted by the grating.

Preferably the diffraction grating means comprises a long period diffraction grating filter.

Alternatively the diffraction grating means comprises a Bragg photonic band-gap crystal.

Preferably the hybridised optoelectronic device further includes wavelength-locking means for locking the laser onto one of a plurality of predetermined wavelengths.

Preferably, the tunable laser is a multi-section laser.

Conveniently, the wavelength measuring means further comprises: input power measuring means for measuring input power of the incident beam; output power measuring means for measuring output power of a beam transmitted by the grating and processing means to calculate the proportion of input power to output power to determine the proportion of power transmitted and hence to determine the wavelength of the transmitted beam.

Advantageously, the input power measuring means comprises input sampling means for providing a sampling beam from the beam emitted by the laser and an input photoelectric diode to measure power of the sampling beam.

Conveniently, the input sampling means comprises an input beam splitter.

Preferably, the input beam splitter comprises a refractive index discontinuity in a waveguide through which the input beam is transmitted, such that a proportion of the incident beam is deflected out of the waveguide by the discontinuity.

Conveniently, the tunable laser has a first power output facet and an opposed second monitoring output facet and the input sampling means is adapted to sample a beam output from the second monitoring output facet.

Preferably, the diffraction grating means is such that the proportion of power of the input beam transmitted by the diffraction grating means is proportional to the wavelength of the input beam.

Conveniently, the output power measuring means comprises output sampling means for sampling power transmitted by the diffraction grating means and an output photoelectric diode to measure output sampled power.

Advantageously, the output sampling means comprises an output beam splitter.

Conveniently, the output beam splitter comprises a refractive index discontinuity in a waveguide through which the output beam is transmitted, such that a proportion of an incident beam is deflected out of the waveguide by the discontinuity.

Alternatively, the output beam splitter comprises a photonic band-gap artificial crystal in a waveguide through which the output beam is transmitted, such that a proportion of an incident beam is deflected out of the waveguide by the artificial crystal.

Advantageously, the wavelength locking means comprises: a Fabry Perot or Fizeau etalon for transmitting only laser beams of predetermined wavelengths, the etalon being located in an output beam from the laser, and power measuring means for measuring the power of the output beam transmitted by the etalon and feedback means for controlling the wavelength of the beam emitted by the laser dependant on the power measured by the power measuring means.

Preferably, the tunable laser, the wavelength measuring means and the wavelength locking means are arranged in a planar array.

Conveniently, the optoelectronic device further includes one of a silicon, a silicate and a silicate-on-silicon substrate.

Advantageously, the wavelength locking means comprises a Fabry Perot etalon of glass or quartz, or a Fizeau etalon of glass or quartz or a gas-filled void.

Alternatively, the optoelectronic device is used in combination with wavelength locking means external to the device.

According to a second embodiment of the first aspect of the invention, there is provided an optoelectronic device comprising: a silicon or silicate substrate, a multi-section laser mounted on the silicon or silicate substrate, an output optical fiber optically count to the laser for transmitting a laser beam from a first power output facet of the leser, a first integrated waveguide for transmitting a monitoring beam from a second monitoring output facet of the laser to an input of a long period grating is filter, a beam splitter in the first waveguide for splitting the monitoring beam between the long period grating filter and a first photoelectric diode for measuring the power of the monitoring beam, a second integrated waveguide connected between an output of the long period grating filter and an input of a Fabry Perot or Fizeau etalon adapted to transmit predetermined frequencies, a second beam splitter in the second integrated waveguide for splitting a laser beam emergent from the long period grating filter, a second photoelectric diode for measuring the power of the beam emergent from the long period grating filter, a third photodiode for measuring power emitted from the etalon for determining when the power of the beam emitted from the etalon is a local maximum corresponding to one of the predetermined frequencies, and control means for controlling currents to sections of the laser, dependent on a signal received from the third photodiode, whereby the wavelength of a beam radiated from the laser may be determined by the filter means to produce a look-up table of laser operating conditions to produce a given wavelength and the control means may be used to lock the laser to one of the predetermined frequencies.

According to a second aspect of the invention, there is provided a beam splitter in an optical waveguide having a longitudinal axis, the beam splitter comprising an interface in the waveguide between a first portion of the waveguide having a first refractive index and a second portion having a second refractive index, wherein the interface is inclined to the longitudinal axis to reflect, or tap, out of the waveguide a proportion of optical radiation incident on the interface.

Conveniently, the optical waveguide is a planar optical waveguide.

Preferably, the interface is inclined at substantially 45 degrees to the longitudinal axis.

Advantageously, the optical waveguide is formed on a plane of a substrate and the interface is inclined to reflect a portion of the incident beam parallel to the plane of the substrate.

Conveniently, the interface taps a proportion of the incident beam into a second waveguide, preferably forming a T-junction or a Y-junction.

Alternatively, the optical waveguide is formed on a plane of a substrate and the interface is inclined to reflect a portion of the incident beam perpendicular to the plane of the substrate.

According to a third aspect of the invention, there is provided a method of forming a beam splitter in an optical waveguide having a longitudinal axis, the method comprising the step of forming an interface in the waveguide between a first portion of the waveguide having a first refractive index and a second portion having a second refractive index, wherein the interface is inclined to the longitudinal axis to reflect a proportion of optical radiation incident on the interface out of the waveguide.

Conveniently, the step of forming an interface comprises the steps of providing a region of photosensitive material within the first portion of the waveguide and exposing the photosensitive material to ultraviolet light to from the second portion.

Alternatively, the step of forming an interface comprises the steps of cutting a slot in the waveguide and filling the slot with material of a different refractive index from that of the waveguide.

Conveniently, the step of filling the slot comprises filling the slot with nitrogen.

According to a fourth aspect of the invention, there is provided a method of characterising a hybridised optoelectronic device comprising a tunable multi-section laser hybridised with wavelength measuring means, the method comprising the steps of a) providing data input/output means stepwise to increment electric currents to sections of the multi-section laser such that the laser emits laser radiation, b) using the wavelength measuring means to measure the wavelength of radiation emitted from the laser and c) storing in a look-up table the values of the currents supplied to the sections of the laser corresponding to the measured wavelengths.

Conveniently, the hybridised optoelectronic device further comprises wavelength locking means, and in step b) the wavelength locking means is used to determine when the laser is emitting at one of a plurality of predetermined wavelengths, and in step c) the look-up table is used to store the values of the currents supplied to the sections of the laser corresponding to the predetermined wavelengths.

Preferably, the wavelength measuring means includes a filter transmitting a proportion of an incident beam dependent on the wavelength of the incident beam and the step of using the wavelength measuring means comprises the steps of measuring the power of the incident light; measuring the power of light transmitted by the filter and determining the proportion of the incident beam transmitted to calculate the wavelength of the incident bear Conveniently, the step of measuring the power of the incident beam comprises the steps of: providing a beam splitter in the path of the incident beam; using the beam splitter to deflect a predetermined proportion of the incident beam out of the waveguide, and measuring the power of the proportion of beam deflected out of the waveguide.

According to an embodiment of the fourth aspect of the invention, there is provided a method of characterising a hybridised optoelectronic device comprising a tunable multi-section laser, having front, gain, phase and back sections; hybridised with an optical filter for transmitting a proportion of power of an incident light beam emitted by the laser, the proportion being dependant on the wavelength of the incident light beam, the method including the steps of: a) applying constant currents to the gain and phase sections such that the leser emits laser radiation; b) applying back and front currents in stepwise increments to the back and front sections respectively; c) measuring power output by the laser to determine values of front and back currents for which the laser emits radiation at wavelengths remote from mode boundaries of the laser; d) measuring the proportion of power transmitted by the filter to measure the wavelength of the emitted radiation; and e) storing in a look-up table the values of front and back current for which the laser emits radiation at wavelengths remote from mode boundaries and the corresponding wavelengths of the radiation.

Preferably, step b) comprises applying sampling currents to determine the position of the mode boundaries.

Conveniently, the step of applying sampling currents comprises the steps of b1) holding the front current at a first front constant and stepping the back current, b2) holding the front current at a second front constant and stepping the back current, b3) holding the back current at a first back constant and stepping the front current, b4) holding the back current at a second back constant and stepping the front current, and b5) stepwise increasing the front current from a third front constant to a fourth front constant while stepwise decreasing the back current from a third back constant to a fourth back constant in order to determine stable middle lines within each super-mode.

Preferably, having determined the stable middle lines, subsequent steps of stepping the back current and/or the front current respectively comprises stepping the respective current through a window of a plurality of incremental values along the stable middle lines and determining for which of the plurality of incremental values the power output is a minimum, and repeatedly incrementing each of the plurality of incremental values and re-determining the current value corresponding to the minimum output power within the window to determine a current value corresponding to a local minimum in the power output.

Advantageously, step e) comprises determining midpoints between the current values corresponding to local minima in the power output to obtain stable middle points of operation of the laser and storing data representative of such stable middle points together with the corresponding wavelength of emitted laser light in the look-up table.

Preferably, operational conditions for operating the frequencies between the stable middle point frequencies are determined by determining and storing in the look-up table the required values of phase current injected into the phase section of the laser.

Conveniently, the required values of phase current are determined by holding the back and front currents constant successively at a first stable point and incrementing the phase current until a frequency of laser emission corresponding to a next stable point is reached and calculating what increments of phase current are required to step from the first stable point to the second stable point in desired frequency increments.

Advantageously, gain currents injected into the gain section of the laser are stored in the look-up table such that the laser can be operated at the same power output at all frequencies.

An embodiment of the present invention will now be described, by way of example only, with reference to the accompanying drawings, in which:

FIG. 1 shows a schematic side view of an optoelectronic device according to the present invention;

FIGS. 2(a) and 2(b) show a side view and top plan view respectively of another embodiment of an optoelectronic device according to the present invention;

FIGS. 3(a) and 3(b) show a side view and a top plan view respectively of a third embodiment of the present invention;

In the figures, like reference numerals refer to like parts.

Figure 1:
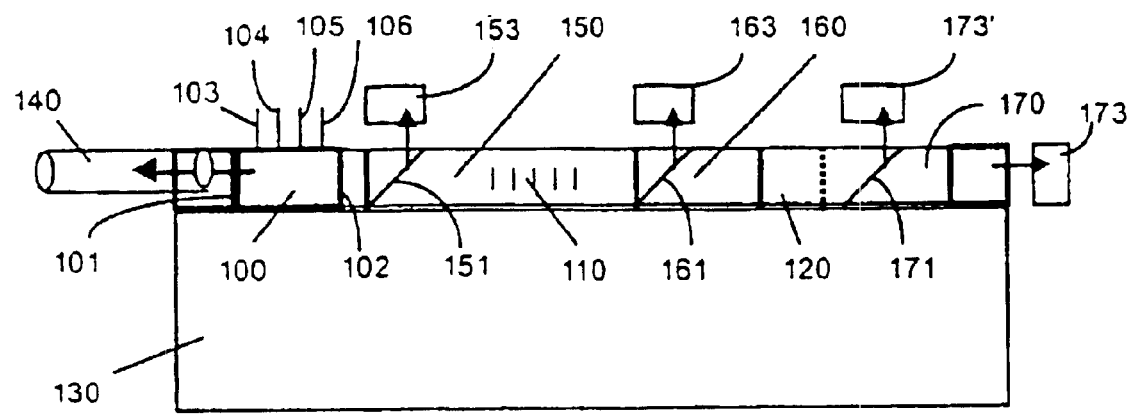

Referring to FIG. 1, there is shown a schematic view of an optoelectronic device 1 in which a multi-section laser 100, long period grating, or feature extraction filter, 110, and a Fabry Perot etalon 120 are serially hybridised on a silicon substrate 130. Alternatively, a silicate or silicate-on-silicon substrate may be used. The laser may be, for example, a known four-section InGaAsP sampled grating distributed Bragg reflector, (SG-DBR) or gain coupled grating reflector (GCSR) laser. In the latter case one grating section is a middle section, the coupler. Alternatively, a superstructure SG-DBR (SSG-DBR) laser may be used. In another embodiment, a five-section laser may be used, the fifth section being a semiconductor optical amplifier to provide a higher power output. In another embodiment, a three-section laser is hybridised rather than a four-section or five-section laser. An electro-absorption modulator (EAM) may be monolithically integrated, or hybridised with the laser to provide data modulation of the laser output.

The Fabry Perot or Fizeau etalon may be of glass or quartz, known per se. An alternative embodiment of the etalon is a vacant slot in the waveguide of precise dimensions that may be filled with gas such as nitrogen or other transparent material. Filling with nitrogen may be achieved under nitrogen pressure at a hybrid silicate/silicon packaging stage. The slot itself may be created, for example by dry etching or laser ablation, when processing the planar lightwave circuit. Rather than being connected to the inline, hybridised Fabry Perot etalon, the output of the long period grating, or feature extraction filter, may be connected to an external frequency locker, not shown Input leads 103,104,105,106 are provided for injecting currents into the sections of the laser respectively. A first output facet 101 of the laser is optically connected to an output optical fiber 140. The optical fiber may be located in a V-groove in the silicon substrate for case of positioning in relation to the laser.

A second facet 102 of the laser, opposed to the first facet, (or beam split light from the first facet 101 in the case of a GCSR) is optically connected by a first integrated optical waveguide 150 to the long period grating, or feature extraction filter, 110. The waveguide may be, for example, silicate glass on silicate substrate. Alternatively, the waveguide layer may be another glass, or silicon or another semiconductor. The waveguide layer may be deposited on silicate, glass, silicon or another semiconductor substrate. Within the integrated optical waveguide there is located a first beam splitter 151 for diverting a proportion of the light emitted from the second facet 102 of the laser towards a first photodiode 153. The photodiode may be a known InGaAs photodiode.

In an alternative embodiment, the laser, waveguide and photodiodes may form a monolithic device in a semiconductor alloy, rather than being combined in a hybrid device.

Figure 7:
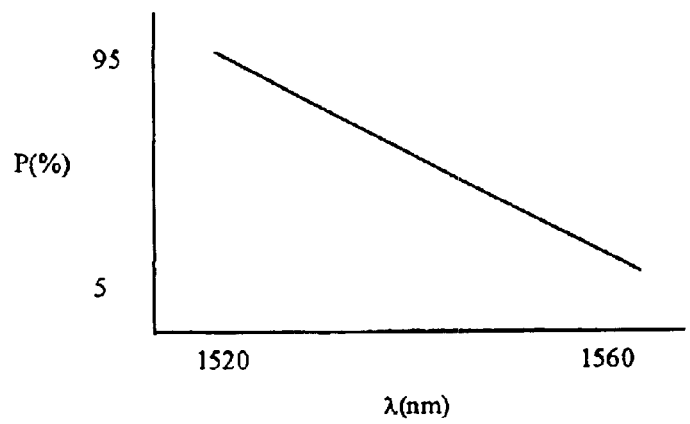
FIG. 7 is a graph showing the relationship between percentage power transmitted and wavelength of a filter used in the present invention.

The known long period grating, or feature extraction filter, has a transmission characteristic in which the percentage of power transmitted in linearly inversely proportional to the wavelength of incident light, as shown in FIG. 7. For example, a transmission percentage varying from 10% to 90% in the range 1520 nm to 1560 nm in a substantially linear manner is useful for C-band operation. Variations of 5% to 95% have been achieved. This range is crucial to precision wavelength identification.

The output of the long period grating, or feature extraction filter, 110 is optically connected by a second integrated waveguide 160 to the input of the Fabry Perot etalon 120. A second beam splitter 161 in the second integrated waveguide 160 deflects a proportion of light emergent from the long period grating, or feature extraction filter, 110 towards a second photodiode 163.

The Fabry Perot etalon is designed to transmit only light of predetermined frequencies, that is a comb of wavelengths. For a telecommunications application, these may be the frequencies of an International Telecommunications Union frequency plan for Wavelength Division Multiplexing. The output of the Fabry Perot etalon is optically connected to a third integrated waveguide 170 to direct light to a third photodiode 173 aligned with the laser, filter and etalon. The third photodiode may be connected by a fiber pigtail located in a V-groove in a similar manner to that in which the output optical fiber 140 is connected to the optoelectronic device. Alternatively a mirror 171 may be provided in the waveguide 170 to direct the light perpendicularly out of the waveguide towards a third photodiode 173' aligned with the first photodiode 153 and the second photodiode 163.

The first, second and third waveguides may be embedded or rib waveguides. The first and second beam splitters 151,161 may each be a simple facet formed from a groove in the respective waveguide or may be a Fresnel reflector as described below. The mirror 171 may be a facet similar to the beam splitters but coated with aluminum to provide a high reflectivity.

Instead of the long period grating, or feature extraction filter, filters of other types may be used. For example, a photonic band-gap crystal with the transmission spectrum in FIG. 7, that is a slowly changing spectral response, may be utilized. Alternatively, a fiber optic coupler designed to separate two wavelength bands at 1480 nanometers and above is very suitable for C-band use, as such a coupler has an almost linear transmission power characteristic, decreasing with increasing wavelength. Such a coupler can be calibrated with a wave-meter and then used repeatedly without further accessing the wave-meter. In this embodiment, the long period grating, or feature extraction filter, is therefore omitted and replaced with a simple waveguide. Light from the waveguide passes through the fiber filter before reaching the second photodiode. Other possible filters are an optical fiber with an embedded diffraction grating or a colored glass filter, for example, of a type used with NdYAG lasers.

Instead of the Fabry Perot etalon 120, a Fizeau etalon may be used.

Although, in this embodiment, the monitoring functions are carried out from light emitted from a "rear" face of the laser, all these monitoring functions can be carried out from the "front" power output face. This is particularly so in the case of a gain coupled sampled grating reflector (GCSR) laser, for example.

Figure 2A:
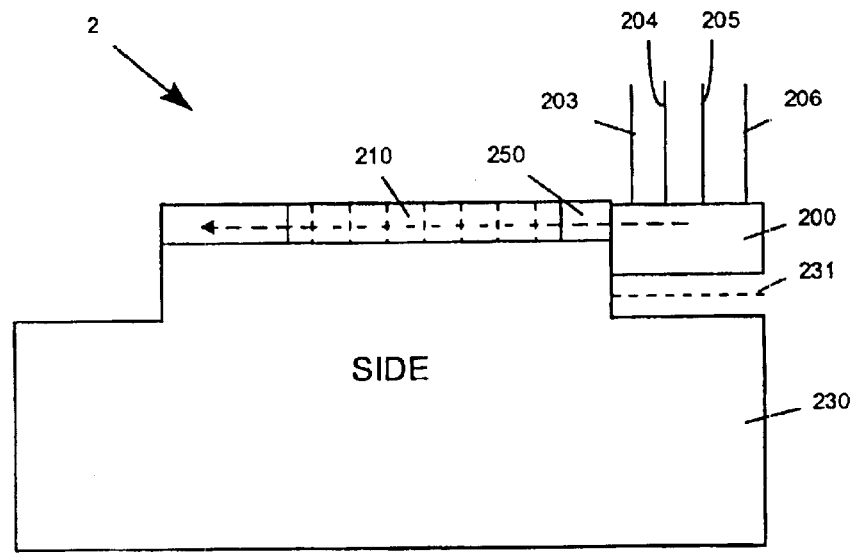
Figure 2B:
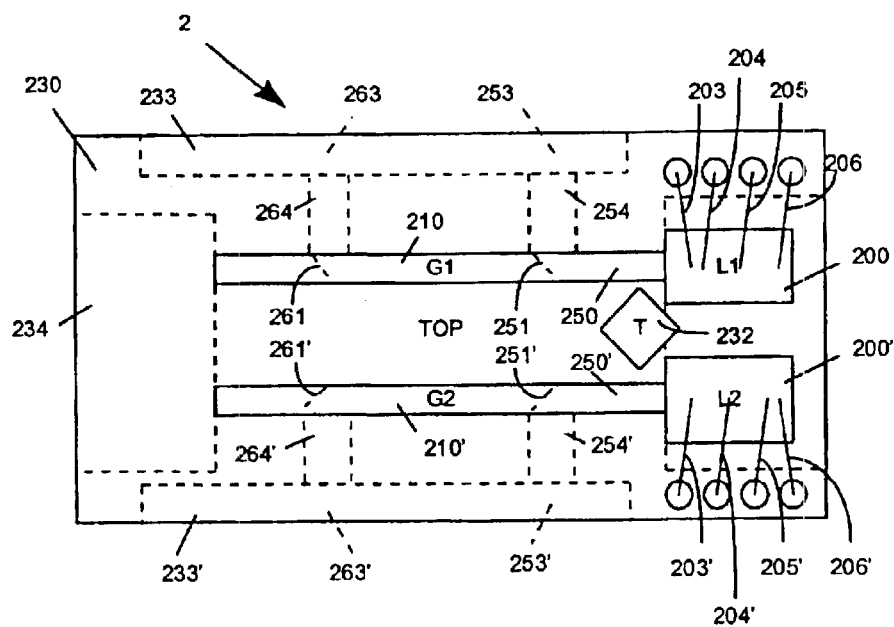

Side and top plan views of a second embodiment of an optoelectronic device 2 according to the invention are shown in FIGS. 2(a) and 2(b) respectively. Two multi-section lasers 200, 200' are mounted side by side on a substrate 230. As shown in the side view, the lasers are mounted on a submount and/or spacer 231, or alternatively, solder pads are provided in a flip-chip embodiment. This represents an embodiment where more than one laser is hybridised onto a single carrier planar light-wave circuit (PLC), for example, for wavelength division multiplexing. A thermistor chip 232, known per se is mounted on the substrate adjacent to the lasers to monitor the temperature of the lasers and provide a signal to a Peltier cooler, not shown, to stabilise the temperature, typically to within 0.01 deg. C. The respective sections of the respective lasers are provided with leads 203, 204, 205 and 206 and 203', 204', 205' and 206' respectively. Output facets of the respective lasers are optically connected to respective waveguides 250, 250'. Long period grating, or feature extraction filters 210, 210' are located in the respective waveguides 250, 250', one of these is shown schematically by broken lines in the side view. Respective first beam splitters 251, 251' are located in the respective waveguides 250, 250' between the respective lasers and the respective long period gratings, or feature extraction filters to deflect a proportion of the light from the respective lasers along respective waveguides 254, 254', perpendicular to the waveguides 250, 250', to respective terraces for the mounting of respective chip photodiodes 253, 253', Similarly, respective second beam splitters 261, 261' are provided in the respective waveguides downsteam of the respective long period gratings, or feature extraction filters 210, 210' to deflect a proportion of light emergent from the respective long period grating, or feature extraction filters, along second waveguides 264, 264' perpendicular to the waveguides 250, 250', towards the respective terraces for the mounting of second photodiodes 263, 263', At ends of the respective waveguides remote from the respective lasers there is provided a further terrace 234, where the second photodiodes 263, 263' may alternatively be mounted or where a third pair of photodiodes may be located. In the first alternative the second perpendicular waveguides 264 and 264' are dispensed with. In the second alternative, the third photodiodes measure the output from a Fabry Perot or Fizeau etalon for frequency locking.

The terraces, reflector slot, etalon slot, grating corrugations and/or photonic band-gap crystal features may be created by dry etching or by laser ablation.

Figure 3A:
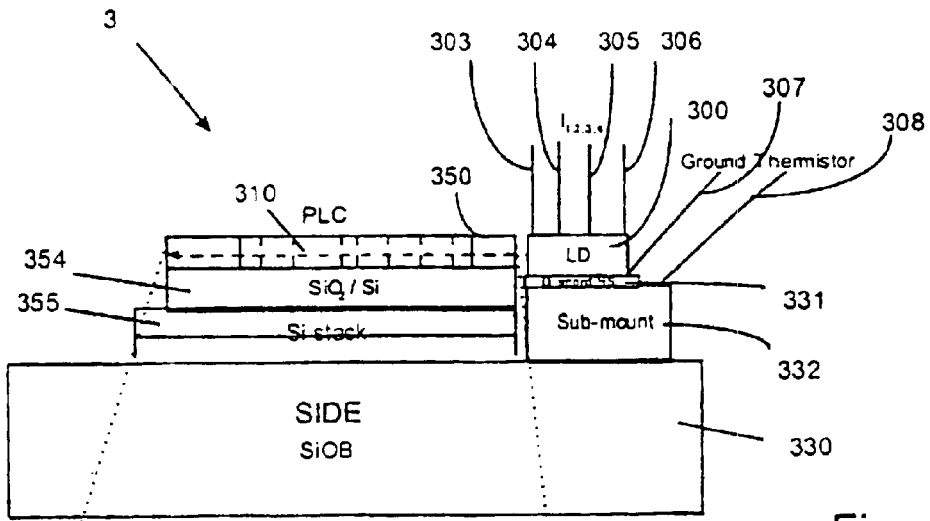
Figure 3B:
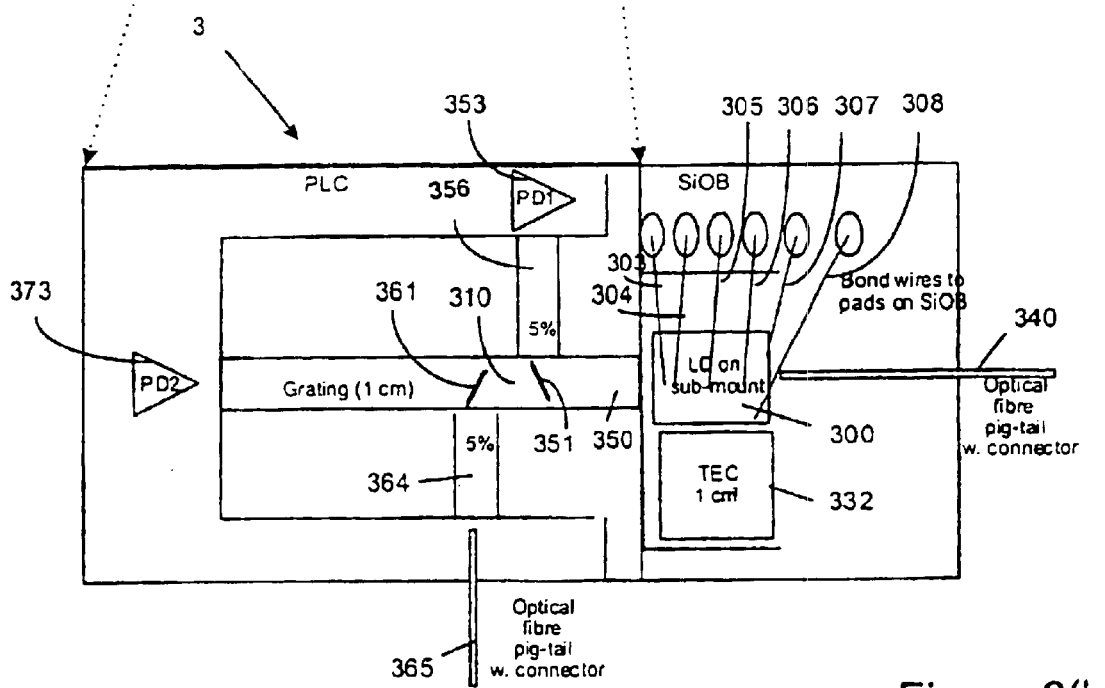

Side and top plan views of a third embodiment 3 of the optoelectronic device or planar light-wave circuit, of the present invention are shown in FIGS. 3(a) and 3(b) respectively. A multi-section laser 300 is mounted on a diamond heat sink 331, which is mounted on a sub-mount 332 located on a substrate, or silicon optical bench (SiOB), 330. Adjacent to the laser there is provided a thermoelectric (or Peltier) cooler (TEC) 332 for stabilising the temperature of the laser. The sections of the laser are provided with leads 303, 304, 305 and 306 for the injection of respective currents into the respective sections. In addition a ground lead 307 is connected to the face of the laser in contact with the diamond heat sink. Another lead 308 is connected to a thermistor, not show, located on the sub-mount for controlling the thermoelectric cooler 332. A waveguide 350 mounted on a silica/silicon layer 354 on a silicon stack 355 on the substrate 330 is aligned with a first output facet of the laser 300. An optical fiber pigtail connector 340 is optically connected to an opposed second output facet of the laser. The waveguide 350 is provided with a long period grating, or feature extraction filter, 310, shown schematically by broken lines in the side view. Between the laser and the long period grating, or feature extraction filter, is a first beam splitter 351 for deflecting a proportion of a beam transmitted along the waveguide from the laser along a perpendicularly disposed second waveguide 356 to a first photodiode 353. Downstream of the long period grating, or feature extraction filter, a second beam splitter 361 is located in the waveguide 350 to deflect a proportion of the light emergent from the long period grating, or feature extraction filter, along a perpendicularly disposed third waveguide 364 to a second optical fiber pigtail connector 365. A second photodiode 373 is located at an end of the waveguide 350 remote from the laser 300 to detect light emergent from the waveguide.

The first beam splitter 351 and/or the second beam splitter 361 may be Y-junctions, in which the Y-junction geometry is determined conventionally to tap a required percentage of light.

The long period grating may be created by, for example, etching corrugation features in the upper surface or sides of the waveguide before depositing a cladding layer, or by doping through a mask. The long period grating is amenable to this approach because the corrugations are well spaced.

Figure 4:
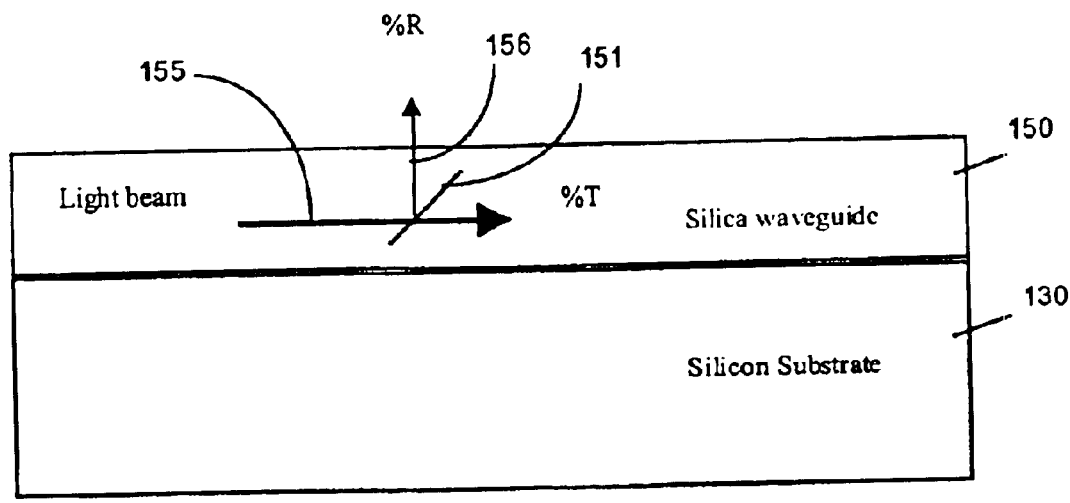
FIG. 4 shows a side view of a beam splitter used in the present invention.

Details of the first beam splitter 151 in the waveguide 150 on the substrate 130 of the first embodiment are shown in FIG. 4. A light beam 155 is split by the beam splitter 151 so that a small proportion 156 is deflected out of the waveguide in a direction perpendicular to a surface plane of the substrate 130. The second beam splitter 161 is identical to the first beam splitter 151.

Figure 5:
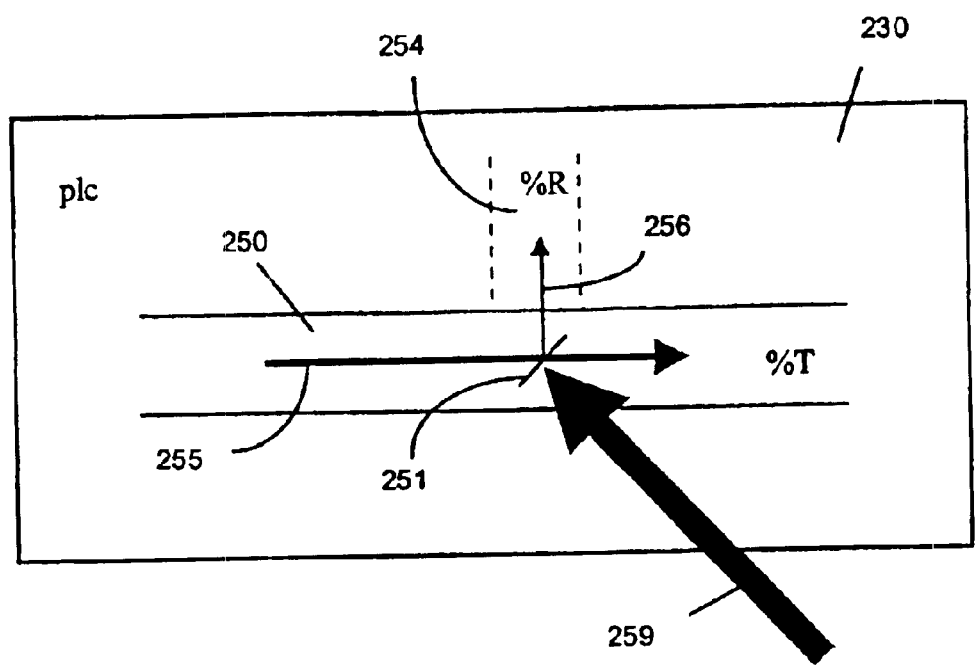
FIG. 5 shows a method of forming a second embodiment of a beam splitter for use in the present invention.

Details of the first beam splitter 251 in waveguide 250 on substrate 230 of the second embodiment are shown in FIG. 5. A light beam 255 is split by the beam splitter 251 so that a small proportion 256 is deflected out of the waveguide 250 in a direction parallel to a surface plane of the substrate 230. The deflected beam 256 may be caused to be transmitted along a perpendicularly disposed second waveguide 254.

Figure 6:
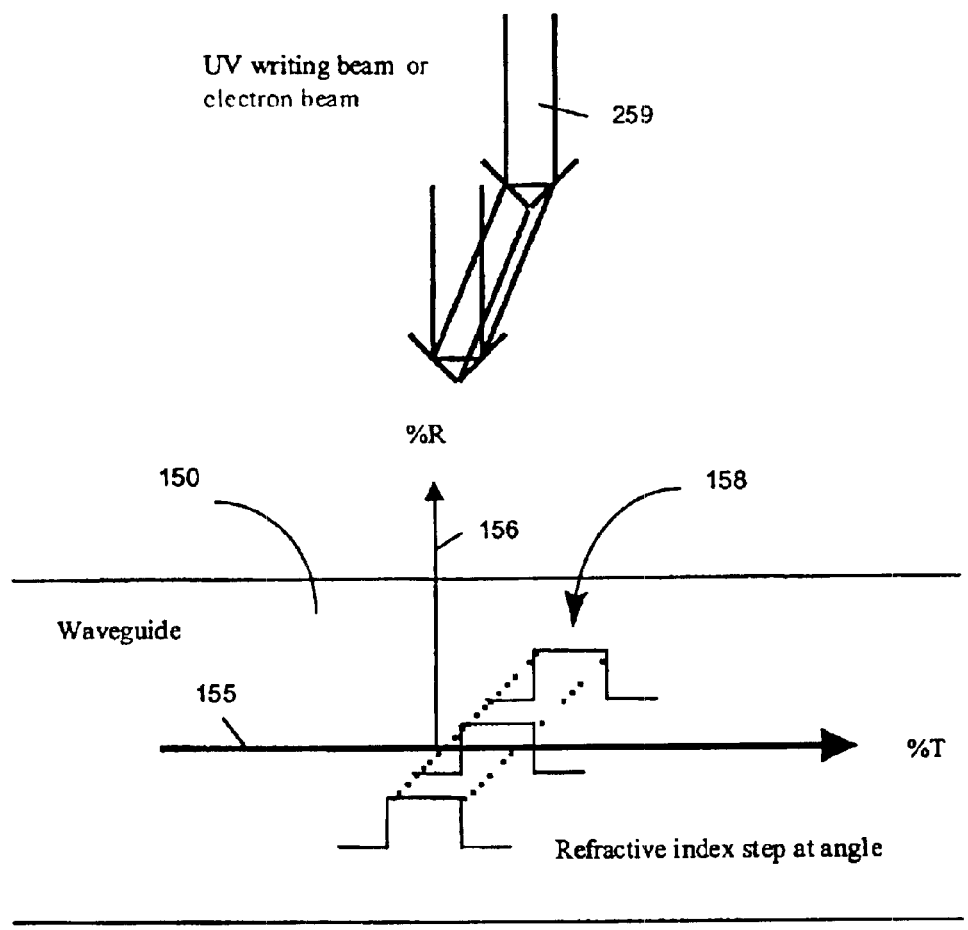
FIG. 6 illustrates a method of forming the beam splitter of FIG. 4 or 5.

The beam splitter is a Fresnel reflector in which a portion 158 of the waveguide has a refractive index different from that of the rest of the waveguide 150. The portion of waveguide of different refractive index may be formed by etching a slot in the waveguide or by selective deposition of the waveguide, or, as illustrated by arrow-headed line 259 in FIGS. 5 and 6, by ultraviolet illumination of a region of photosensitive material in the portion of the waveguide. A similar procedure to that known for creating a grating in a glass optical fiber may be used, in which the refractive index of the waveguide material is permanently altered by ultraviolet light, for example, from an excimer laser. The sensitivity of the waveguide material may be enhanced by prior loading with hydrogen. The ultraviolet illumination may be directed from above or from the side of the waveguide to elevate, or lower, in a step wise mode or otherwise, the refractive index of the portion so as to form an interface between the portion and the rest of the waveguide at an angle to the longitudinal axis of the waveguide. Conveniently the interface is formed at 45 degrees to the longitudinal axis. The ultraviolet illumination may be directed by focusing or by a mask, or using holography, in a manner known per se. This embodiment of the beam splitter is particularly suited to low percent reflectors for high-power lasers or where a plurality of additional waveguides are required for additional optical processing.

Alternatively, the beam splitter may be formed by etching a slot using an electron beam. Such a slot penetrates the waveguide a predetermined amount to deflect the required proportion, say 5% to 10%, of an incident light beam. That is, the dimensions of the slot are defined such that a required percentage of the light is tapped. These dimensions may be partly defined by the known process of frustrated total internal reflection.

The reflection may also be achieved, or the feature extraction filter formed, by appropriately positioning an array of photonic crystals at a junction with another guide to deflect or transmit a desired power and spectral content to another waveguide appropriately aligned. For example, the photonic crystals may be in an array of vertical pillars of micrometer diameter dimensions, which deflect or transmit light with the required spectral response. This array of photonic band-gap crystals in the form of an array of nano-structure pillars, reflect in the optical wavelength domain in an analogous manner to that in which natural crystals reflect X-rays.

Alternatively, the beam splitter may be a waveguide Y-junction tap.

It will be evident to a person skilled in the art that such a beam splitter has further applications wherever it is required to deflect or reflect light in an optical waveguide, including an optical fiber, out of the waveguide for sampling or monitoring. Other applications in integrated or hybridised optics circuits will also be apparent to those skilled in the art.

The hybridised optoelectronic device of the invention has the advantages of compactness, miniaturisation, high-speed and reliability associated with hybridisation or integration. Moreover, the hybridisation device is suitable for volume production.

Figure 8:
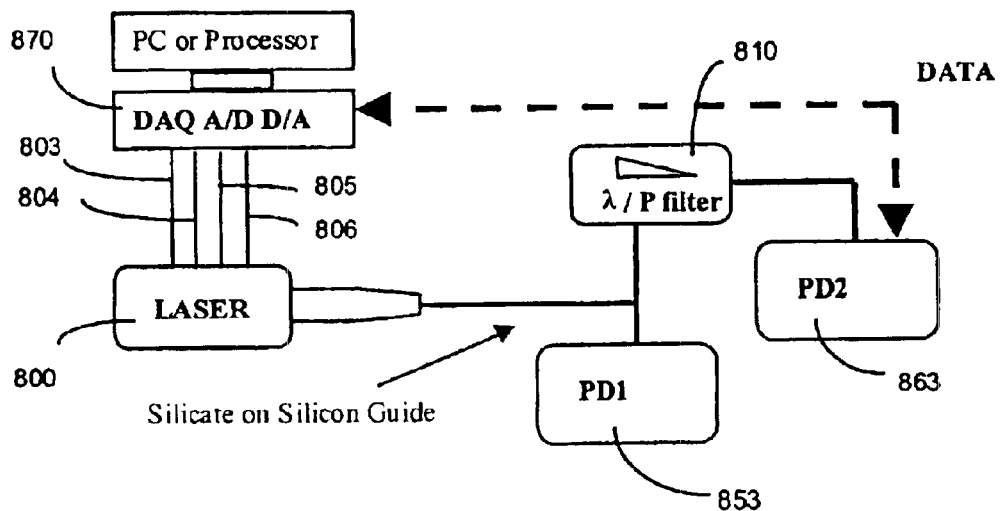
FIG. 8 shows schematically the method of characterising the optoelectronic device of the present invention.

A means of characterising any of the embodiments of the optoelectronic device of the invention is illustrated in FIG. 8. A data input/output unit 870 is used to increment currents via the leads 803, 804, 805 and 806 to respective sections of a multi-section laser 800, and also to read currents from photodiodes 853, 863 which sample the power of light emitted by the laser before and after the light passes through a long period grating, or feature extraction filter, 810. Since the proportion of power transmitted by the long period grating, or feature extraction filter, 810 is dependent in a known manner on the wavelength of the light, this enables the wavelength of the light to be determined. In general, where the relationship is linear the relationship may be described by the equation:

Wavelength=m(power transmitted by filter/power into filter)+c
where m and c are constants The constants m and c are derived from an initial filter throughput spectrum. For non-linear filters, a modified calculation is used to determine wavelengths.

A microprocessor may be used instead of the data input/output unit. An application specific circuit (ASIC) with embedded or connected memory may be used, particularly when high speed wavelength switching is required.

In general, the method of characterising the optoelectronic device is as follows. Currents to three or four sections of the multi-section laser are automatically swept in predetermined increments and the wavelength of the emitted light calculated at each setting using the known characteristics of the long period grating, or feature extraction filter. The wavelengths and corresponding currents supplied to each of the sections may then be stored in a look-up table.

Figures 9, 10:
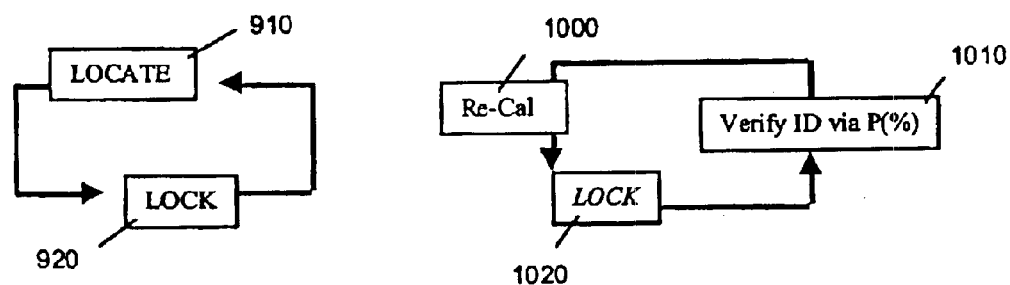
FIG. 9 shows schematically a method of wavelength locking for use with the present invention.
FIG. 10 shows schematically a method of re-calibration for use with the present invention.

For use where predetermined wavelengths are required, as in a telecommunications environment, the optoelectronic device may incorporate a Fabry Perot etalon, as shown in FIG. 1, or other wavelength-locking device. Then, when the currents to the sections of the laser are set so that the laser emits at one of the predetermined wavelengths, such as an ITU channel wavelength, the third photodiode 173 records a local maximum power detected. The control currents corresponding to these wavelengths may then be stored in a look-up table. This procedure is illustrated in FIG. 9, in which, for the long period grating, or feature extraction filter, the proportion of power transmitted by the long period grating, or feature extraction filter, is used to locate, step 910, the wavelength, that is, channel identification is achieved, and then, using the Fabry Perot etalon, at maximum signal from the third photodiode 173, see FIG. 1, the drive currents lock, step 920, to the predetermined wavelength. Similar locking may be achieved with an external frequency locker.

As illustrated in FIG. 10, the optoelectronic device may be re-calibrated during use. The full sequence of steps is as follows. An initial calibration produces a look-up table. Thereafter a continuous cycle operates of: set wavelength; lock; verify predetermined wavelength Occasional minor re-calibration, step 1000, of the laser in situ is carried out using wavelength Fabry Perot locker etalon to amend the look-up table values. This is permitted by a simple current tweaking algorithm to seek maximum third photodiode signal. The full cycle is then: set wavelength, step 910; lock, step 920; verify predetermined wavelength, step 1010; re-calibrate, step 1000 and lock, step 1020.

With this method of characterisation, a single data acquisition unit with multiple input and output channels can replace a plurality of electric current sources and a wavelength meter or analyser of the prior art, while also avoiding the time consuming characterisation of the prior art. It has proved possible to reduce a week-long session of the prior art to a couple of minutes, utilizing fast data processing algorithms to be described, which are suited to volume production of the devices. A further benefit of the short characterizations time is that the effect of environmental changes, and particularly temperature changes, that de-stabilise optical equipment, are minimised.

In a telecommunications application, a further reduction in the time may be achieved, due to the redundancy in the data, by noting that only six to eight super-modes are sufficient to cover the entire ITU frequency plan. This approach can also avert misrepresenting data wander with device ageing.

Figure 11:
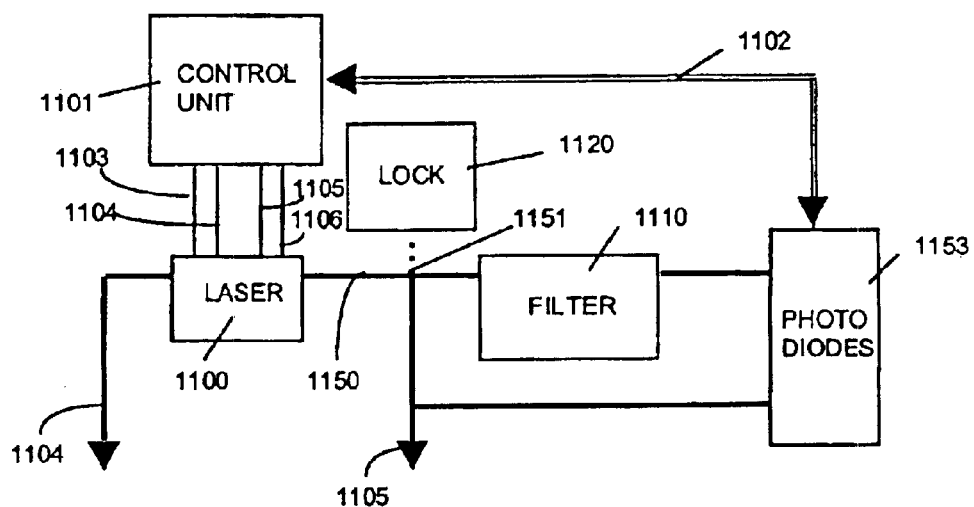
FIG. 11 shows schematically a second embodiment of the method of characterising the optoelectronic device of the present invention.
Figure 12:
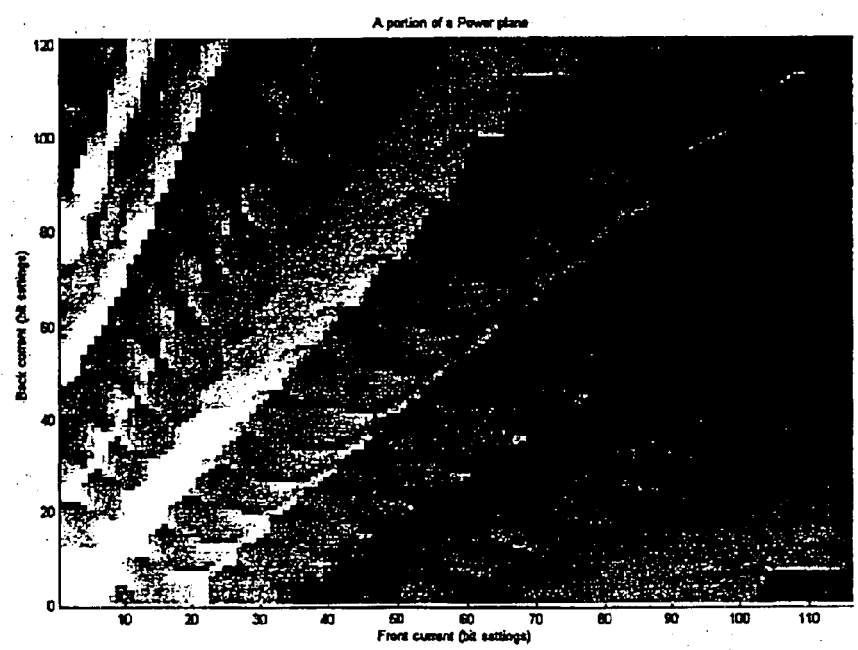
FIG. 12 shows a plot, useful in understanding the method of characterisation of the present invention, of a power plane plotted against current injected in a front section and current injected in a back section of a multi-section laser used in the optoelectronic device of the current invention.

A characterisation set-up suitable for volume production of optoelectronic devices according to the invention is illustrated in FIG. 11. The sections of a multi-section laser 1100 are driven through leads 1103, 1104, 1105, 1106 by a controller 1101. Light emitted by the laser is transmitted by a waveguide 1150 to a long period grating, or feature extraction filter, 1110, used to determine the wavelength of light emitted by the laser. This determination is carried out using a beam splitter 1151 to sample the power entering the filter. The sampled power and the power transmitted through the filter are measured by photodiode circuits 1153. The wavelength is verified as being one of a plurality of predetermined wavelengths by further sampling the light emitted by the laser by a Fabry Perot etalon or other frequency locker 1120. Data generated by the photodiode circuits 1153 is transmitted by a data bus 1102 to the controller 1101. A first laser light output 1104 from the device is taken from a facet opposed to that from which light for characterising is taken or from an alternative output 1105 from the characterising facet.

Figure 13:
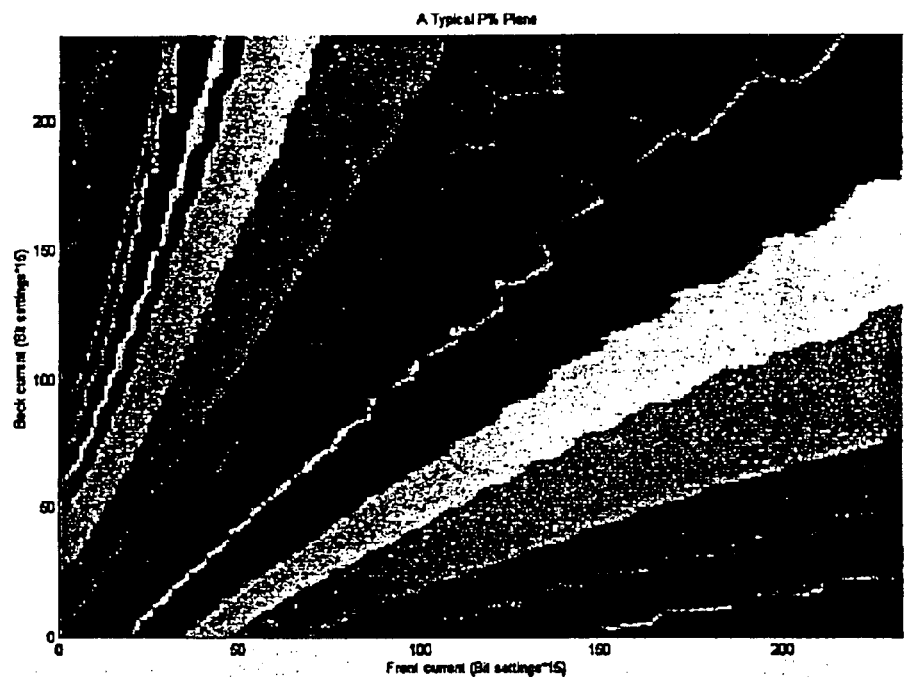
FIG. 13 shows a plot, useful in understanding the method of characterisation of the present invention, of a wavelength plane plotted against current injected in a front section and current injected in a back section of a multi-section laser used in the optoelectronic device of the current invention.

A sampling method used in a fast method of characterising optoelectronic devices of the invention may be understood by considering FIGS. 12 to 21. A phase plane, FIG. 12, in which the degree of shading represents the measured power output, is created by holding the gain and phase currents constant for a four-section laser and incrementing both the currents to the front and back sections of the laser. By front and back sections are to be understood Bragg diffraction grating sections of a laser which are located at either end of the laser in the case of a SG-DBR laser and at one end and a central section in the case of a GCSR laser. The currents may, for example, be incremented from 0 mA to 40 mA in 0.01 mA steps, corresponding to 1–4000 bits. This plot corresponds to the direct power measured for each combination of front and back current measured by the first photodiode 153 in FIG. 1. The corresponding plot of the percentage power transmitted by the long period grating, or feature extraction filter, 1110, see FIG. 11, is shown in FIG. 13, where the degree of shading represents the percentage of power transmitted. Since the percentage power transmitted can be related to the wavelength of the light, FIG. 13 may also be regarded as a wavelength plane.

Figure 14:
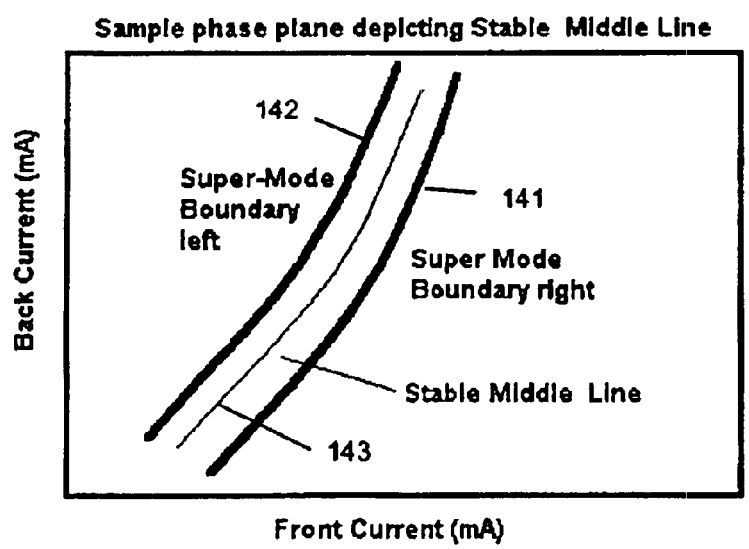
FIG. 14 shows a graph, useful in understanding the method of characterisation of the present invention, of current injected in a front section versus current injected in a back section of a multi-section laser used in the optoelectronic device of the current invention, in the region of a mode boundary.

Using this wavelength plane it is possible to visualise the boundaries between super-modes. Referring to FIG. 14, the stable operational points are then sought midway between these mode boundaries 141, 142 along a stable middle line 143.

Figure 15:
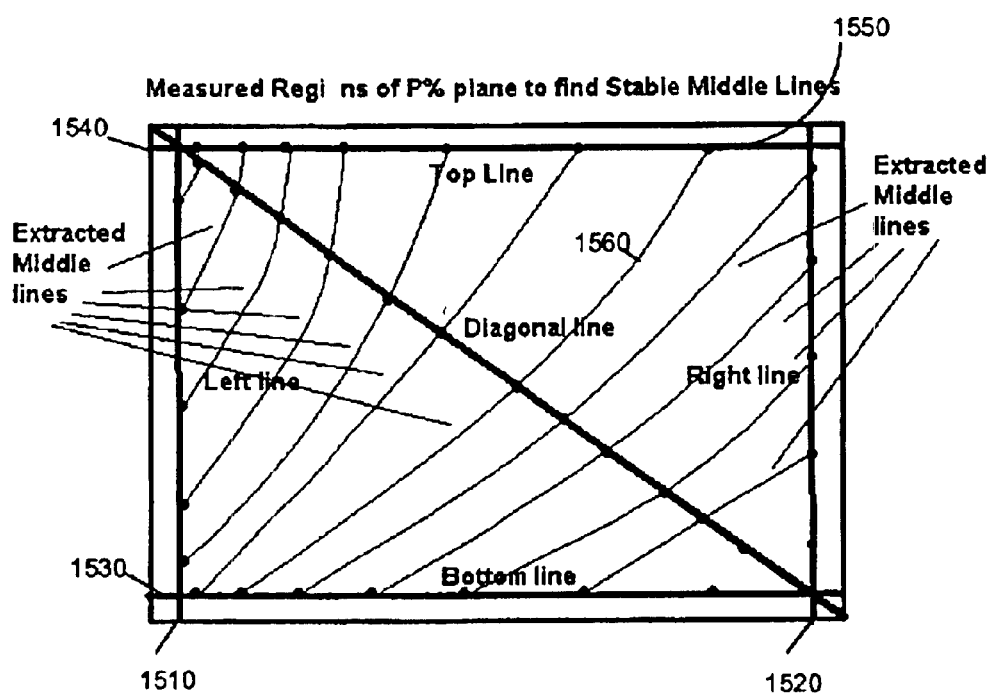
FIG. 15 shows a plot, useful in understanding the method of characterisation of the present invention, of current injected in a front section and current injected in a back section of a multi-section laser used in the optoelectronic device of the current invention, showing how the position of a mode boundary is determined.

As shown in FIG. 15, the position of these stable lines can be obtained by sampling. Measurements are made along five lines of measurement as follows: 1) the front current is held at a first constant value 1510 and the back current varied, 2) the front current is held constant at a second value 1520 and the back current varied, 3) the back current is held constant at a first value 1530 and the front current is varied, 4) the back current is held constant at a second value 1540 and the front current is varied, and 5) the front current is increased from the first constant value 1510 to the second constant value 1520 while the back current is decreased from the second constant value 1540 to the first constant value 1530. In the case of GCSR lasers, in the fifth step, the front and back currents respectively may be varied between different constants, to accommodate a different orientation of the super-modes in GCSR lasers.

Figure 16:
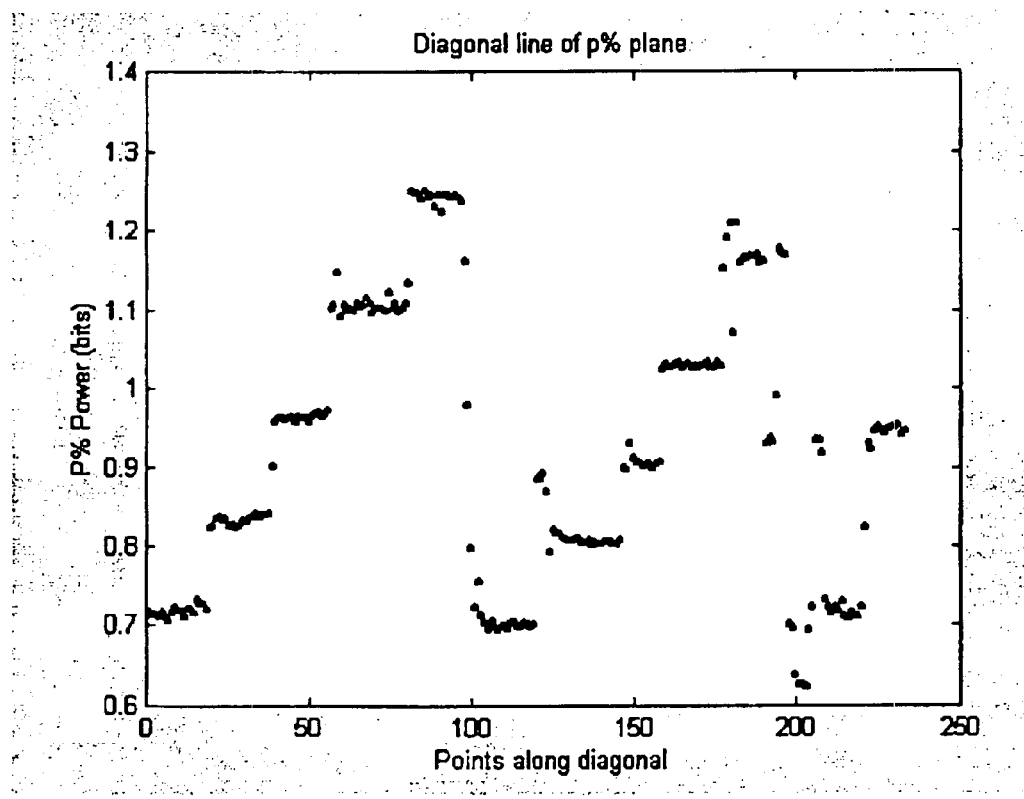
FIG. 16 shows a plot, useful in understanding the method of characterisation of the present invention, of wavelength along the diagonal shown in FIG. 15.

The periodic wavelength variation along each of these lines of measurement is depicted in FIG. 16, wherein the super-mode boundaries are the steps between the horizontal clusters of points. (The apparent cycling through two or three peaks is an artefact produced by cycling through lighter to darker shading two or three times to depict the output wavelength.) The requirement is to pick the center point of each of these clusters, corresponding to points 1550 on FIG. 15, in order to determine the positions of the stable middle lines 1560. An acceptable approximation 1560 (see FIG. 15) to these midpoint lines can then be plotted.

Figure 17:
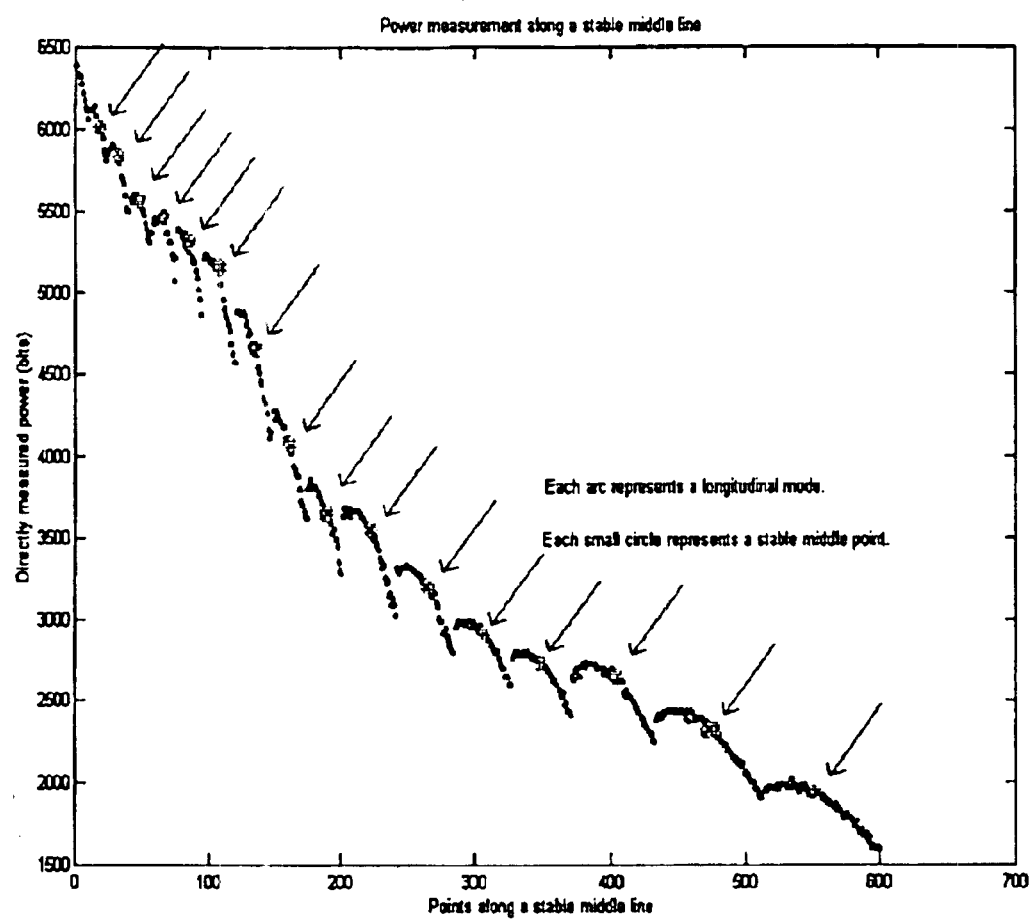
FIG. 17 shows a graph of the power output of the laser of the present invention along a stable line between two mode boundaries.

Moving along such a middle line and measuring the direct power for each point results in a plot such as that shown in FIG. 17. The requirement then is to find the stable points which are taken to be midway between two local minima in the power output. To determine the local minima a moving window is used which has a fixed number of measurement points, for example, initially 10 points. The point, within the 10 points of the window, having a minimum power value is recorded and then the window moved by one point to determine the new point having a minimum power. A local minimum is that point which returns a minimum value for each of 10 successive movements of the window. However, as can be seen from FIG. 17, further along the middle line a wider window is required to encompass the wider arcs, up to 150 measurement points, for example.

Having established the local minima, the positions of the stable middle points can be located as shown in FIG. 17, being midway between local minima As the position of the stable middle points are established they may be stored in a look-up table.

In order to cover the full frequency range between the stable points, the phase current of the laser may be varied. It is therefore necessary to determine the phase current increments required to cover the full frequency range from one stable middle point in a phase plane to the next stable middle point in the same super mode and the same phase plane. Such stable middle points are shown as dots in FIG. 18. Thus Point A is at one frequency $f_a$ and Point B is at another frequency $f_b$. In order to operate the laser at frequencies between these frequencies the phase current is incremented. By increasing phase current and moving along the middle line, stable points are passed through which are at a frequency higher than Point A but lower than Point B. It is required to find what phase current increment for Point A will produce the same frequency as Point B.

This is done by going to Point B and finding the corresponding frequency and then holding front and back currents constant while the phase current is increased until the laser operates at the original frequency. In this manner the required phase increment is determined.

The "distance" between every stable middle point and the next is determined from the front grating current $I_f$ and back grating current $I_b$ as $(I_f^2 + I_b^2)^{1/2}$ which has units mA. This distance, and the corresponding phase increment, is split into, for example, 14 parts, see FIG. 19, so that every increment along the middle line of distance/14 corresponds to an increment of phase current of phase current increment/14. Mme effect in this example is to increment frequency by $(f_a - f_b)/14$, see FIG. 20.

The maximum precision in the frequency control of the laser can be achieved instead of dividing by 14, by dividing the distance by the phase value that will give the distance required to move along the phase plane for one bit added to the phase current. The precision in the control of frequency is given by the frequency jump between points divided by phase current increment and has the units GHz/mA. The ultimate frequency control precision can be found in a closely related manner involving greater phase current increment for the same frequency increase.

The frequency may be determined with a frequency meter, but for high volume production a sample method from the percentage power admitted plane may be used. The percentage power transmitted plane is effectively a wavelength plane and when the feature extract filter is sufficiently accurate, the wavelength of each point can be directly identified.

By measuring the first point in each super-mode (labelled 1 to 8 in FIG. 18 for eight supermodes) and combining both frequency/phase and "distance" relation to provide a figure in GHz/mA² the frequencies of every point can be determined.

Every relevant point can then be selected and very fine tuning around this point can be implemented so that the most accurate operating points are determined for the particular frequency in the required frequency plan (e.g. the ITU grid).

Figure 18:
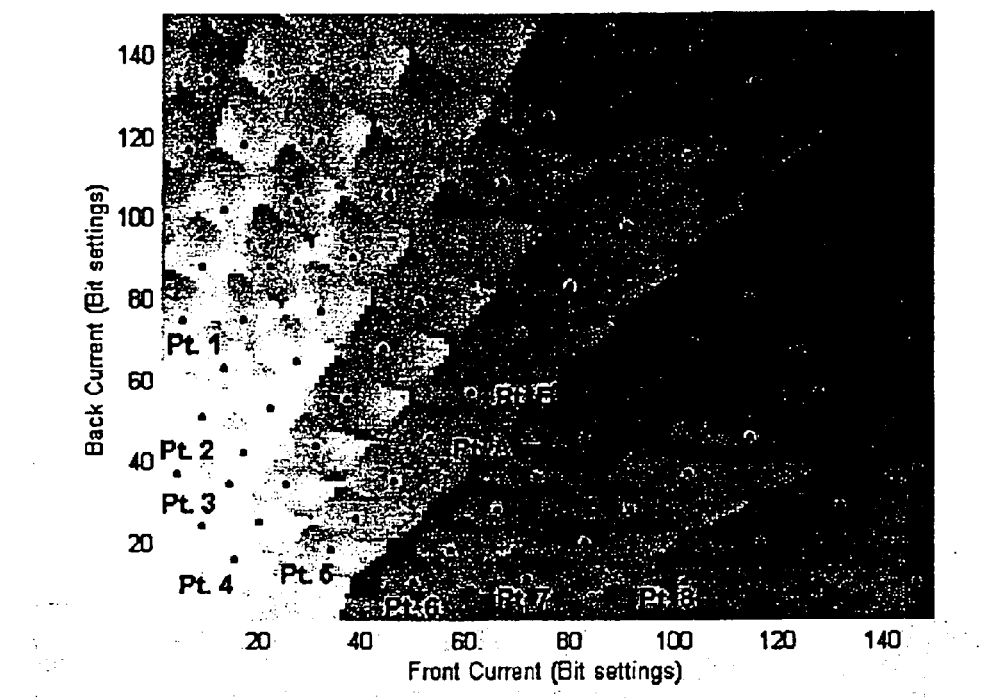
FIG. 18 shows a plot, useful in understanding the determination of phase current settings for use with the method of characterisation of the present invention, of a power plane against current bit settings injected in a front section and current bit settings injected in a back section of a multi-section laser used in the optoelectronic device of the current invention.
Figure 19:
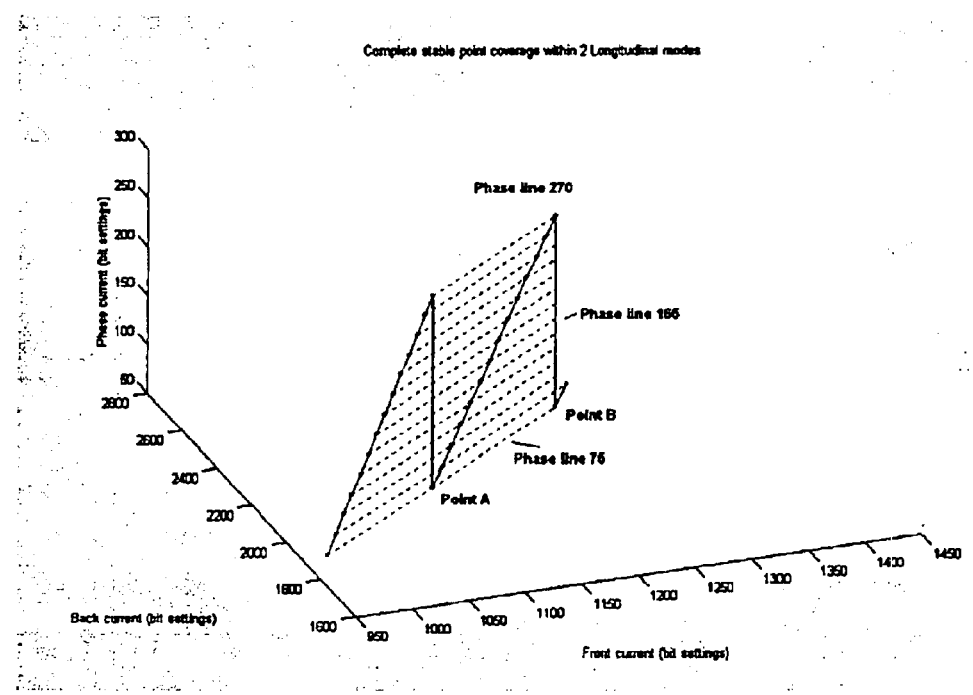
FIG. 19 shows a three dimensional plot of phase current versus back current and front current, for use with the method of characterisation of the present invention.
Figure 20:
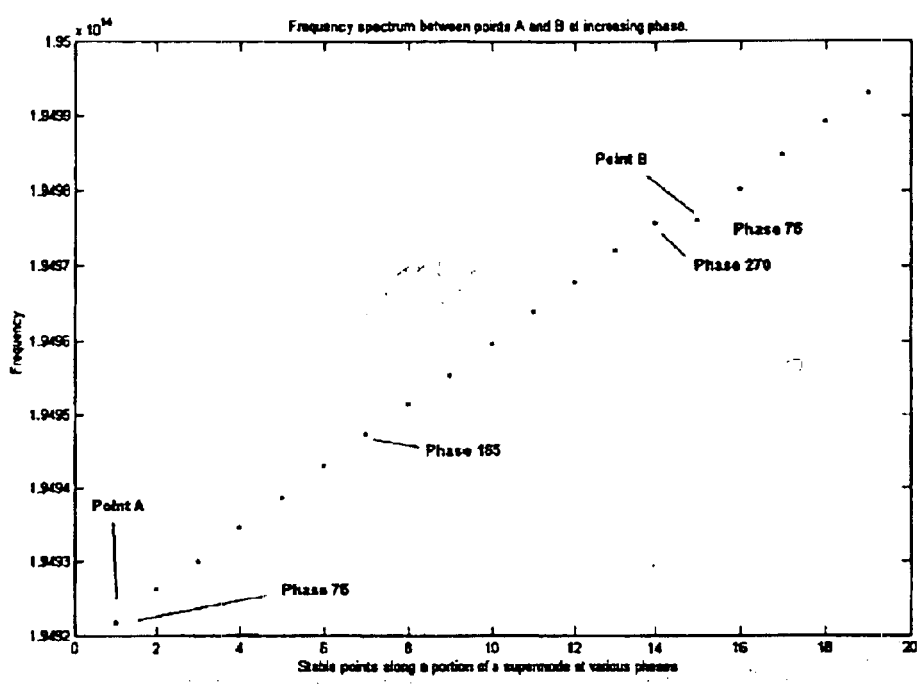
FIG. 20 shows a graph of frequency versus stable points along a supermode, for use with the method of characterisation of the present invention.

In one very fast version of the above, only one numbered point in FIG. 18 needs to be measured with a frequency meter to identify all others in the plan.

By repeating the cycle of steps above for gradually increased gain section current, $I_G$, an interpolation process allows optical power to be included in the look-up table data where it is desirable to have constant power at all frequencies in the plan.

There are many alternatives to the above techniques.

For example to determine the stable middle points it is found that digital processing of the power and P% data can give satisfactory results, if in a slower fashion. The phase planes can be differentiated or passed through various digital filters combined with smoothing techniques, thereby accentuating the features before identifying the mode boundaries. When the super-modes and longitudinal modes, arcs in FIG. 17, are finally located the center of each region thereby defined can be located as a stable point as in FIG. 18. This set can then be measured with a frequency meter. A set is obtained for each phase current Interpolating for phase current between these sets gives a threefold current, ($I_F$, $I_B$, $I_P$), for each frequency in the desired frequency plan.

Figure 21:
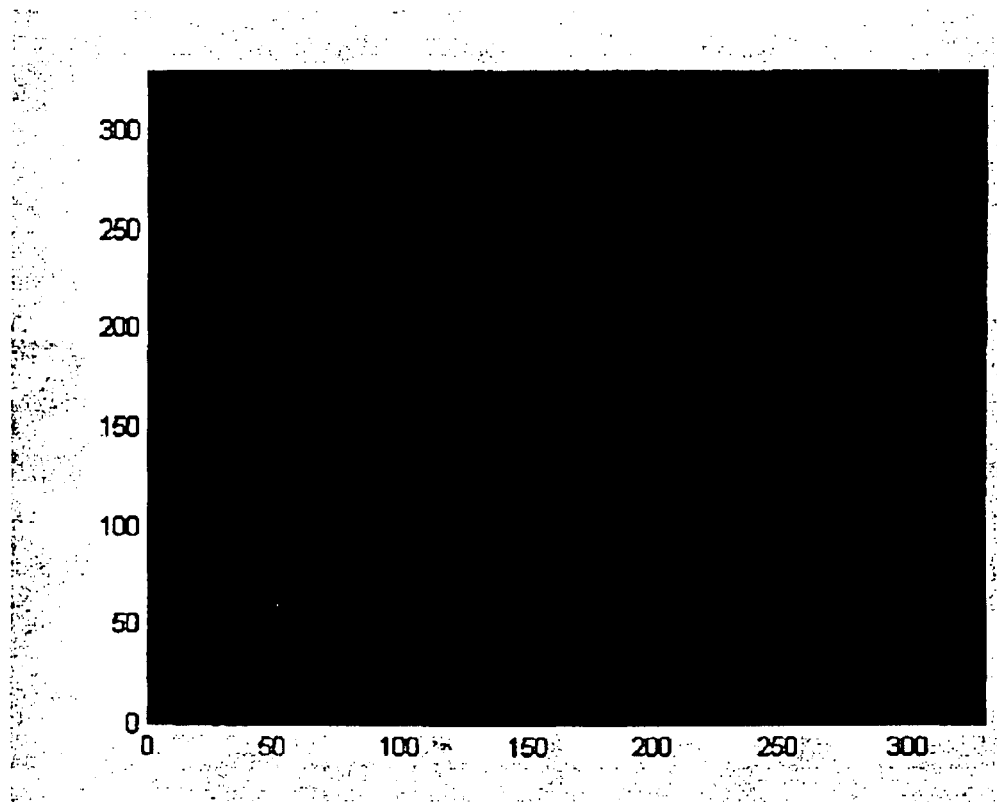
FIG. 21 shows a plot of a differential plane of powers plotted against front current and back current, use fill in understanding an embodiment of the method of characterisation of the present invention.

An example of one of these methods is as follows:

1. Measure a full P% percent plane.
2. Apply an 'Angled Differentiator'. i.e. [001][000][−100] i.e. convolve the plane with the above matrix
3. Find a chop value for these peaks so that only supermode boundaries are found in the differentiated plane, as follows:
4. Extract a diagonal (like the diagonal mentioned above).
5. Apply a moving average filter to this data (i.e. take the average of say four subsequent points and use as the first point in a new array, increment along the original data by 1 and repeat). This will give an array of points, 4 points fewer than the measured data.)
6. This will give an array of peaks with the largest peaks corresponding to supermode jumps. The local largest peaks using the same algorithm may be found as mentioned above, finding the local maxima.
7. The peaks are sorted, largest, first and then the five largest ones are removed and the average of the next five is found. A value about 20% of the calculated diagonal average is taken to be the chop value.
8. This chop value is applied to the differentiated plane and all points above are replaced with the value 1 and all points equal to or below are set as 0. An example is shown in FIG. 21.
9. Run an algorithm which can track each supermode and thus fit a curved line to each boundary. The middle lines can then be found.
10. Differentiating the power planes twice gives a plane showing all boundaries, both super-mode and longitudinal. The points common to these and the middle lines are middle "longitudinal boundary points". The midpoints between this last set are the stable operating points.

Power uniformity may be achieved as follows, note that the use of D/A current drivers means that currents are designated in bits.

After extracting middle lines each super-mode (or middle line) is taken in turn, The power of the first and last points is measured (gain is at maximum) and then the gain current setting of the first is decreased until the power from the first is the same as the power from the last. Then the power/gain current ratio is calculated, i.e. the difference in power from the first and last point divided by the change in gain of the first point to achieve power equivalent to the last point.

Power gain ratio simply means that for every change in gain by 1 bit there is a change in power equal to the ratio.

The middle line measurement is obtained; i.e. power along the line is measured.

An array of gain values is created by subtracting the lowest power (i.e. the last point) from the measured power of each point, multiplying by the power/gain ratio and then subtracting this from the maximum gain setting.

Note: for more accuracy the middle line may be split into sections and the power/gain ratio obtained for each section.

Figure 22:
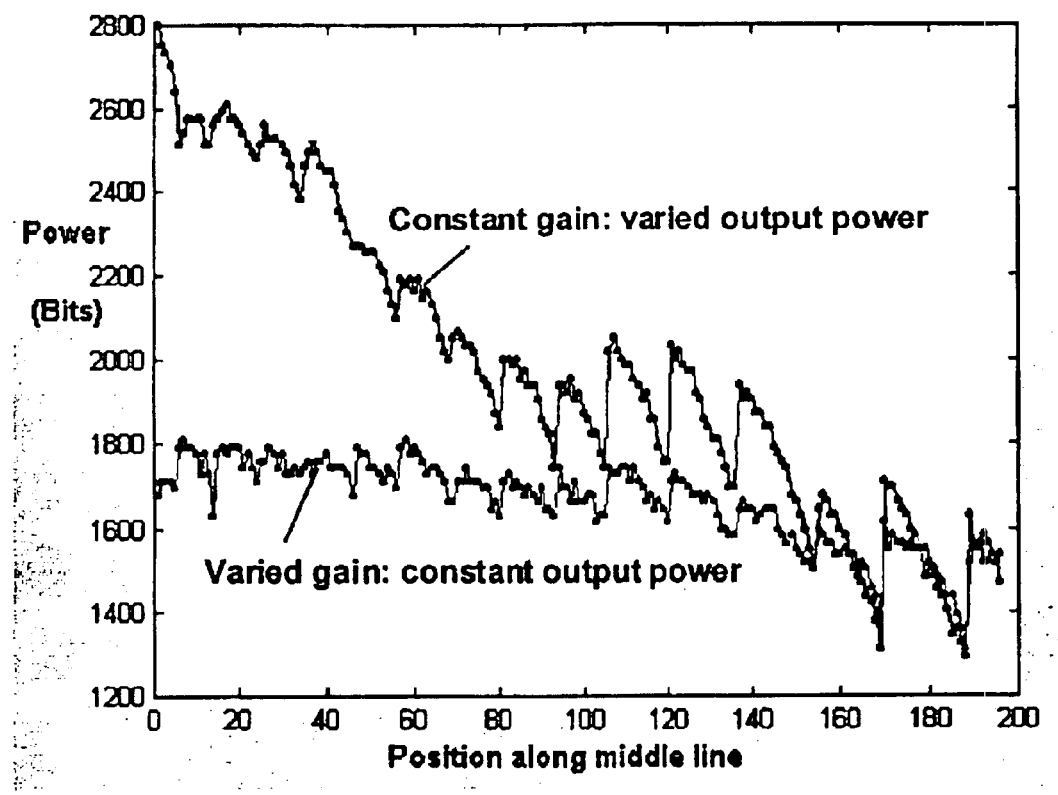
FIG. 22 shows a plot of output power against wavelength for embodiments of the invention.

The next task is to find the gain/phase ratio i.e. for every change in gain there needs to be a change in phase current in order to stay at the most stable point This can be done similarly to the above method: Starting with stable points which were extracted from the above measured middle lines, a stable point at maximum gain is taken and its frequency measured. Then the gain value is applied that was predicted from the above and its frequency measured. The phase current is applied until the frequency is the same and then the change in gain divided by the change in phase calculated, thereby giving the gain/phase ratio. From the estimated gain values an array of 'adjusting' phase values can be created and can be added to the phases values determined above. Plots of output power with constant gain and with gain varied for constant output power are shown in FIG. 22.

What is claimed is:

1. A method of characterising a hybrid optoelectronic device comprising a tunable multi-section laser (1100), having front, gain, phase and back sections; hybridised with an optical filter (1110) for transmitting a proportion of power of an incident light beam emitted by the laser, the proportion being substantially linearly and monotonically dependent on the wavelength of the incident light beam, the method including the steps of: a) applying constant currents to the gain and phase sections such that the laser emits laser radiation; b) applying back and front currents in step-wise increments to the back and front sections respectively; c) measuring power output by the laser to determine values of front and back currents for which the laser emits radiation at wavelengths remote from mode boundaries of the laser; d) measuring the proportion of power transmitted by the filter to measure the wavelength of the emitted radiation; and e) storing in a look-up table the values of front and back current for which the laser emits radiation at wavelengths remote from mode boundaries and the corresponding wavelengths of the radiation.

2. A method as claimed in claim 1, wherein step b) comprises applying sampling currents to determine the position of the mode boundaries (141).

3. A method as claimed in claim 2, wherein the step of applying sampling currents comprises the steps of b1) holding the front current at a first front constant (151) and stepping the back current, b2) holding the front current at a second front constant (152) and stepping the back current, b3) holding the back current at a first back constant (153) and stepping the front current, b4) holding the back current at a second back constant (154) and stepping the front current, and b5) stepwise increasing the front current from a third front constant (151) to a fourth front constant (152) while stepwise decreasing the back current from a third back constant (154) to a fourth back constant (153) in order to determine stable middle lines (143) within each super-mode.

4. A method as claimed in claim 3, wherein, having determined the stable middle lines, subsequent steps of stepping the back current and/or the front current respectively comprise stepping the respective current through a window of a plurality of incremental values along the stable middle lines and determining for which of the plurality of incremental values the power output is a minimum, and repeatedly incrementing each of the plurality of incremental values and re-determining the current value corresponding to the minimum output power within the window to determine a current value corresponding to a local minimum in the power output.

5. A method as claimed in claim 4, wherein step e) comprises determining midpoints between the current values corresponding to local minima in the power output to obtain stable middle points of operation of the laser and storing data representative of such stable middle points together with the corresponding wavelength of emitted laser light in the look-up table.

6. A method as claimed in claim 5, wherein operational conditions for operating the frequencies between the stable middle point frequencies are determined by determining and storing in the look-up table the required values of phase current injected into the phase section of the laser.

7. A method as claimed in claim 6, wherein the required values of phase current are determined by holding the back and front currents constant successively at a first stable point and incrementing the phase current until a frequency of laser emission corresponding to a next stable point is reached and calculating what increments of phase current are required to step from the first stable point to the second stable point in desired frequency increments.

8. A method as claimed in claim 1, wherein gain currents injected into the gain section of the laser are stored in the look-up table such that the laser can be operated at the same power output at all frequencies.

9. A method of characterising a tunable multi-section laser (1100), having front, gain, phase and back sections; the laser being connected to an optical fiber filter (1110) for transmitting a proportion of power of an incident light beam emitted by the laser, the proportion being dependant on the wavelength of the incident light beam, the method including the steps of: a) applying constant currents to the gain and phase sections such that the laser emits laser radiation; b) holding a front current applied to the front section at a first front constant (111) and stepping a back current applied to the back section, c) holding the front current at a second front constant (152) and stepping the back current, d) holding the back current at a first back constant (153) and stepping the front current, e) holding the back current at a second back constant (154) and stepping the front current, and f) stepwise increasing the front current from a third front constant (151) to a fourth front constant (152) while stepwise decreasing the back current from a third back constant (154) to a fourth back constant (153) in order to determine stable middle lines (143) within each super-mode, g) measuring power output by the laser to determine values of front and back currents for which the laser emits radiation at wavelengths remote from mode boundaries of the laser; h) measuring the proportion of power transmitted by the fiber filter to measure the wavelength of the emitted radiation; and i) storing in a look-up table the values of front and back current for which the laser emits radiation at wavelengths remote from mode boundaries and the corresponding wavelengths of the radiation."

10. A method as claimed in claim 9, wherein, having determined the stable middle lines, subsequent steps of stepping the back current and/or the front current respectively comprise stepping the respective current through a window of a plurality of incremental values along the stable middle lines and determining for which of the plurality of incremental values the power output is a minimum, and repeatedly incrementing each of the plurality of incremental values and re-determining the current value corresponding to the minimum output power within the window to determine a current value corresponding to a local minimum in the power output.

11. A method as claimed in claim 10, wherein step e) comprises determining midpoints between the current values corresponding to local minima in the power output to obtain stable middle points of operation of the laser and storing data representative of such stable middle points together with the corresponding wavelength of emitted laser light in the look-up table.

12. A method as claimed in claim 11, wherein operational conditions for operating the frequencies between the stable middle point frequencies are determined by determining and storing in the look-up table the required values of phase current injected into the phase section of the laser.

13. A method as claimed in claim 12, wherein the required values of phase current are determined by holding the back and front currents constant successively at a first stable point and incrementing the phase current until a frequency of laser emission corresponding to a next stable point is reached and calculating what increments of phase current are required to step from the first stable point to the second stable point in desired frequency increments.

14. A method as claimed in claim 9, wherein gain currents injected into the gain section of the laser are stored in the look-up table such that the laser can be operated at the same power output at all frequencies.

* * * * *